United States Patent
An et al.

(10) Patent No.: US 8,680,402 B2
(45) Date of Patent: Mar. 25, 2014

(54) MULTI-LAYER FLEXIBLE PRINTED CIRCUIT BOARD FOR ELECTRONIC DEVICE

(75) Inventors: Jong-Hun An, Gyeongsangbuk-do (KR); Hyun-Sik Min, Gyeongsangbuk-do (KR)

(73) Assignee: Samsung Electronics Co., Ltd (KR)

( * ) Notice: Subject to any disclaimer, the term of this patent is extended or adjusted under 35 U.S.C. 154(b) by 36 days.

(21) Appl. No.: 13/178,081

(22) Filed: Jul. 7, 2011

(65) Prior Publication Data
US 2012/0186856 A1 Jul. 26, 2012

(30) Foreign Application Priority Data
Jan. 21, 2011 (KR) .................. 10-2011-0006298

(51) Int. Cl.
*H05K 1/00* (2006.01)
(52) U.S. Cl.
USPC ........................................ 174/254; 174/255
(58) Field of Classification Search
None
See application file for complete search history.

(56) References Cited

U.S. PATENT DOCUMENTS

| | | | |
|---|---|---|---|
| 4,798,918 A * | 1/1989 | Kabadi et al. ................... | 174/36 |
| 7,312,401 B2 * | 12/2007 | Tsukada et al. ............... | 174/254 |
| 2006/0117450 A1 | 6/2006 | Matsumoto et al. | |
| 2006/0180344 A1 * | 8/2006 | Ito et al. ........................ | 174/262 |

FOREIGN PATENT DOCUMENTS

| | | |
|---|---|---|
| JP | 2002176231 | 6/2002 |
| KR | 1020050037878 A | 4/2005 |
| KR | 1020060064340 A | 6/2006 |

\* cited by examiner

*Primary Examiner* — Ishwarbhai B Patel
(74) *Attorney, Agent, or Firm* — The Farrell Law Firm, P.C.

(57) ABSTRACT

A multi-layer Flexible Printed Circuit Board (FPCB) for an electronic device, in which a plurality of components are provided alternately on a top surface and a bottom surface of a base layer and the components are removed from the other region. The multi-layer FPCB includes a base layer, a first circuit pattern provided on a side region on a top surface of the base layer, a first adhesive layer provided in the first circuit pattern, a second circuit pattern provided on a bottom surface of the base layer and in an other-side region opposite to the side region, a second adhesive layer provided in the second circuit pattern, a first insulating/protecting layer provided on a top surface of the first adhesive layer, and a second insulating/protecting layer provided on a bottom surface of the second adhesive layer.

5 Claims, 5 Drawing Sheets

MULTI-LAYER FLEXIBLE PRINTED CIRCUIT BOARD FOR ELECTRONIC DEVICE

PRIORITY

This application claims priority under 35 U.S.C. §119(a) to a Korean Patent Application filed in the Korean Intellectual Property Office on Jan. 21, 2011 and assigned Ser. No. 10-2011-0006298, the entire disclosure of which is hereby incorporated by reference.

BACKGROUND OF THE INVENTION

1. Field of the Invention

The present invention relates generally to a multi-layer Flexible Printed Circuit Board (FPCB) for an electronic device, and more particularly to a multi-layer FPCB for an electronic device, in which a plurality of components are provided alternately on a top surface and a bottom surface of a base layer and the components are removed from the other region.

2. Description of the Related Art

Generally, in an electronic device, a multi-layer Flexible Printed Circuit Board (FPCB) is used to electrically connect sections of a portion having one or more curves. The multi-layer FPCB was developed to create a compact and lightweight component for electronic devices. The multi-layer FPCB allows for durable and high-density wiring due to its highly repetitive flexural strength, making it very reliable. The multi-layer FPCB has high thermal resistance, durability, and chemical resistance, and because of its high resistance against heat, the multi-layer FPCB has been widely used as a core component in many electronic devices such as cameras, computers, peripheral devices, portable communication devices, and video and audio devices.

Multi-layer FPCBs may be classified into mono-layer FPCBs and multi-layer FPCBs. The mono-layer FPCB has been the most common, but recently, the multi-layer FPCB has come into wide use in spite of the increase in the thickness of the FPCB due to the increase in the number of components of an electronic device.

Figure 1:
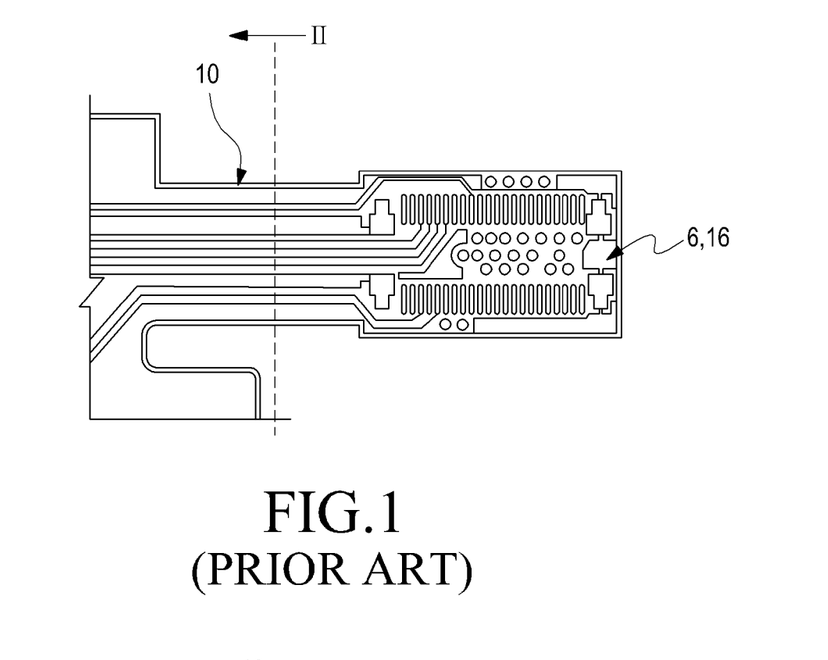
FIG. 1 is a diagram showing a conventional multi-layer Flexible Printed Circuit Board (FPCB) for an electronic device.
Figure 2:
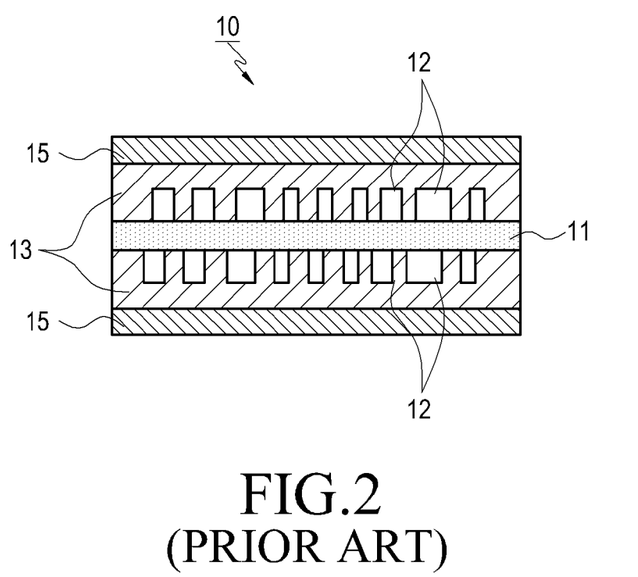
FIG. 2 is a cross-sectional and magnified view of portion II shown in FIG. 1.

As shown in FIGS. 1 and 2, a multi-layer FPCB 10 includes a base layer 11, upper and lower circuit patterns 12 provided on a top surface and a bottom surface of the base layer 11, upper and lower adhesive layers 13 covered onto the upper and lower circuit patterns 12, and insulating/protecting layers 15 provided on a top surface of the upper adhesive layer 13 and a bottom surface of the lower adhesive layer 13.

The multi-layer FPCB includes a circuit-side connector 16 electrically connected with a connector (not shown) of a plurality of FPCBs provided in the electronic device, and the circuit-side connector 16 is connected to the connector (not shown), such that transmission and reception of various signals is achieved.

However, the conventional multi-layer FPCB has low flexibility due to its increase in thickness, which degrades the engagement strength between the connector of the plurality of FPCBs provided in the electronic device and the circuit-side connector. In addition, when the conventional multi-layer FPCB is continuously used for a long period of time, damage and cracking may occur in the circuit-side connector, causing contact failure and thus degrading the reliability of a product.

Therefore, to improve the flexibility of the multi-layer FPCB, there is a need for a device in which circuit patterns, adhesive layers, and insulating/protecting layers are provided alternately on a top surface and a bottom surface of a base layer and the circuit patterns, the adhesive layers, and the insulating/protecting layers are removed from an other-side region than the base layer.

SUMMARY OF THE INVENTION

Accordingly, an aspect of the present invention is to provide a multi-layer Flexible Printed Circuit Board (FPCB) for an electronic device, in which a plurality of components (for example, circuit patterns, adhesive layers, insulating/protecting layers, etc.) are provided alternately on a top surface and a bottom surface of a base layer and the components are removed from the other region, thereby reducing the thickness of a product to improve the flexibility of the product and reducing the manufacturing cost of the product as well as improve engagement strength between a connector of a plurality of PCBs provided in the electronic device and a circuit-side connector of the product.

Another aspect of the present invention is to provide a multi-layer FPCB for an electronic device, in which a plurality of components are provided alternately on a top surface and a bottom surface of a base layer and the components are removed from the other region, thereby preventing damage and cracking from being generated in a position adjacent to a circuit-side connector of a product and thus improving the reliability of the product.

Moreover, another aspect of the present invention is to provide a multi-layer FPCB for an electronic device, in which a plurality of circuit patterns are provided alternately on a top surface and a bottom surface of a base layer, thereby reducing the thickness of a product to further improve the flexibility of the product.

Furthermore, another aspect of the present invention is to provide a multi-layer FPCB for an electronic device, in which a plurality of circuit patterns are provided alternately on a top surface and a bottom surface of a base layer. In one embodiment, a plurality of components are removed from a portion of a region provided on the top surface of the base layer, thereby reducing the thickness, improving the flexibility, and reducing the manufacturing cost of a product to improve engagement strength between a connector of a plurality of FPCBs provided in the electronic device and a circuit-side connector of the product.

In addition, another aspect of the present invention is to provide a multi-layer FPCB for an electronic device, in which a plurality of circuit patterns are provided on a top surface of a base layer and a plurality of components are removed from adjacent regions provided on the top surface of the base layer, thereby reducing the thickness, improving the flexibility, and reducing the manufacturing cost of a product to improve engagement strength between a connector of a plurality of FPCBs provided in the electronic device and a circuit-side connector of the product.

According to an aspect of the present invention, there is provided a multi-layer Flexible Printed Circuit Board (FPCB) for an electronic device, which includes a base layer, a first circuit pattern provided on a side region on a top surface of the base layer, a first adhesive layer provided in the first circuit pattern, a second circuit pattern provided on a bottom surface of the base layer and in an other-side region opposite to the side region, a second adhesive layer provided in the second circuit pattern, a first insulating/protecting layer provided on a top surface of the first adhesive layer, and a second insulating/protecting layer provided on a bottom surface of the second adhesive layer.

According to another aspect of the present invention, there is provided a multi-layer FPCB for an electronic device, which includes a base layer, a first circuit pattern provided on a side region on a top surface of the base layer, a first adhesive layer provided on the top surface of the base layer, a second circuit pattern provided on a bottom surface of the base layer and in an other-side region opposite to the side region, a second adhesive layer provided on the bottom surface of the base layer, a first insulating/protecting layer provided on a top surface of the first adhesive layer, and a second insulating/protecting layer provided on a bottom surface of the second adhesive layer.

According to another aspect of the present invention, there is provided a multi-layer FPCB for an electronic device, which includes a base layer, a first circuit pattern provided on a center region on a top surface of the base layer, a first adhesive layer provided in the first circuit pattern, a second circuit pattern and a third circuit pattern provided on a bottom surface of the base layer and in a side region and an other-side region opposite to the center region, a second adhesive layer provided in the second and third circuit patterns, a first insulating/protecting layer provided on a top surface of the first adhesive layer, and a second insulating/protecting layer provided on a bottom surface of the second adhesive layer.

According to another aspect of the present invention, there is provided a multi-layer FPCB for an electronic device, which includes a base layer, a first circuit pattern provided on a center region on a top surface of the base layer, a first adhesive layer provided in the first circuit pattern, a second circuit pattern provided on a bottom surface of the base layer, a second adhesive layer provided in the second circuit pattern, a first insulating/protecting layer provided on a top surface of the first adhesive layer, and a second insulating/protecting layer provided on a bottom surface of the second adhesive layer.

BRIEF DESCRIPTION OF THE DRAWINGS

The above and other features and advantages of embodiments of the present invention will be more apparent from the following detailed description taken in conjunction with the accompanying drawings, in which.

DETAILED DESCRIPTION OF EMBODIMENTS OF THE PRESENT INVENTION

Hereinafter, embodiments of the present invention will be described in detail with reference to the accompanying drawings. The embodiments disclosed in the specification and structures shown in the drawings are merely exemplary of the present invention, and it should be understood that various variations capable of substituting for the embodiments may exist at the time of filing the application.

Figure 3:
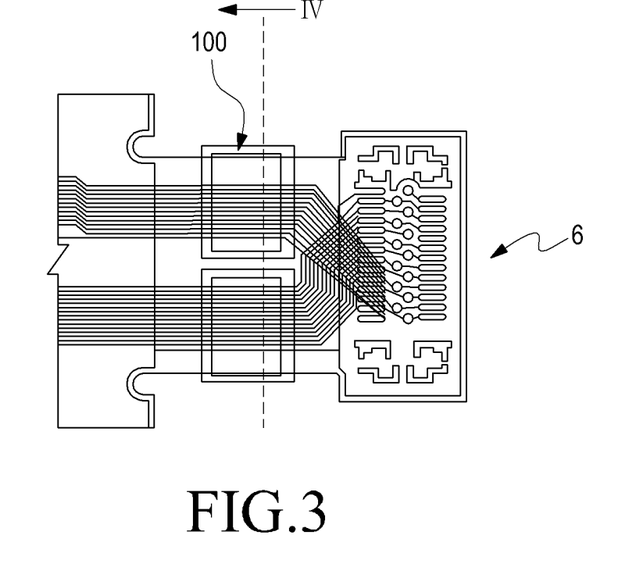
FIG. 3 is a diagram showing a multi-layer FPCB for an electronic device according to an embodiment of the present invention.
Figure 4:
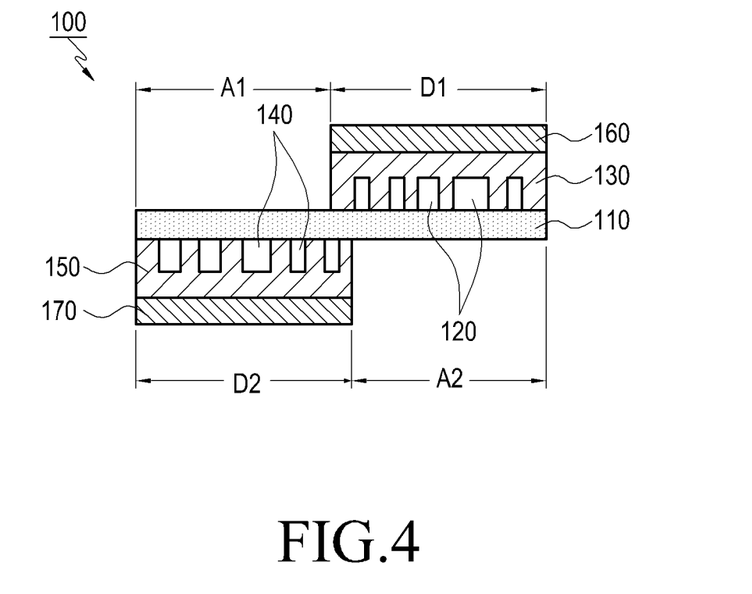
FIG. 4 is a cross-sectional and magnified view of portion IV shown in FIG. 3.

As shown in FIGS. 3 and 4, a multi-layer Flexible Printed Circuit Board (FPCB) 100 for an electronic device according to an embodiment of the present invention includes a base layer 110, a first circuit pattern 120, a second circuit pattern 140, a first adhesive layer 130, a second adhesive layer 150, a first insulating/protecting layer 160, and a second insulating/protecting layer 170.

The first circuit pattern 120 is provided in a side region D1 on a top surface of the base layer 110 to improve the flexibility of the multi-layer FPCB 100. The first adhesive layer 130 is provided in the first circuit pattern 120 for adhesion between the first circuit pattern 120 and the first insulating/protecting layer 160. The second circuit pattern 140 is provided on a bottom surface of the base layer 110 and an other-side region D2 opposite to the side region D1 to improve the flexibility of the multi-layer FPCB 100. The second adhesive layer 150 is provided in the second circuit pattern 140 for adhesion between the second circuit pattern 140 and the second insulating/protecting layer 170. The first insulating/protecting layer 160 is provided on a top surface of the first adhesive layer 130 to insulate/protect the first circuit pattern 120 and the first adhesive layer 130. The second insulating/protecting layer 170 is provided on a bottom surface of the second adhesive layer 150 to insulate/protect the second circuit pattern 140 and the second adhesive layer 150.

As shown in FIG. 4, the first and second circuit patterns 140 and 150, the first and second adhesive layers 130 and 150, the first and second insulating/protecting layers 160 and 170 are disposed alternately.

As shown in FIG. 4, a side region A1 differs from the side region D1 on the top surface of the base layer 110, due to the removal of a portion of the first circuit pattern 120, the first adhesive layer 130, and the first insulating/protecting layer 160. Similarly, an other-side region A2 differs from the other-side region D2 on the bottom surface of the base layer 110 due to the removal of a portion of the second circuit pattern 140, the second adhesive layer 150, and the second insulating/protecting layer 170.

The base layer 110, and the first insulating/protecting layer 160 and the second insulating/protecting layer 170 are formed of film layers or other layers which provide the same effect as the film layers, such as sheet layers, etc.

As shown in FIGS. 3 and 4, the multi-layer FPCB 100 includes the base layer 110, the first circuit pattern 120, the second circuit pattern 140, the first adhesive layer 130, the second adhesive layer 150, the first insulating/protecting layer 160, and the second insulating/protecting layer 170.

As shown in FIG. 4, in the side region D1 on the top surface of the base layer 110 is provided the first circuit pattern 120 in which the first adhesive layer 130 is provided. On the top surface of the first adhesive layer 130 is provided the first insulating/protecting layer 160. From the side region A1, as compared to the side region D1 on the top surface of the base layer 110, are removed the first circuit pattern 120, the first adhesive layer 130, and the first insulating/protecting layer 160.

In this state, as shown in FIG. 4, in the other-side region D2 opposite to the side region D1 on the bottom surface of the base layer 110 is provided the second circuit pattern 140 in which the second adhesive layer 150 is provided. On the bottom surface of the second adhesive layer 150 is provided the second insulating/protecting layer 170. From the other-side region A2, as compared to the other-side region D2 on the bottom surface of the base layer 110, are removed the second circuit pattern 140, the second adhesive layer 150, and the second insulating/protecting layer 170.

As such, the first and second circuit patterns 120 and 140, the first and second adhesive layers 130 and 150, and the first and second insulating/protecting layers 160 and 170, respectively, are arranged alternately on the top surface and bottom surface of the base layer 110, and are removed from the regions A1 and A2, thereby reducing the thickness of a product to improve the flexibility of the product, improving enforcement strength between a connector (not shown) of a plurality of FPCBs (not shown) provided in an electronic device (not shown) and a circuit-side connector 6 of the product. Additionally, the above-described embodiment prevents damage and cracking from being generated in a position adjacent to the circuit-side connector 6 of the product thereby improving the reliability of the product.

Figure 5:
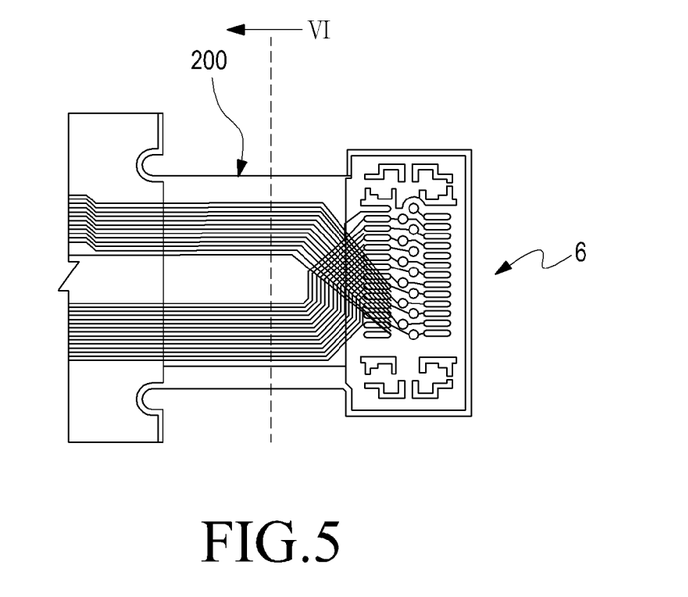
FIG. 5 is a diagram showing a multi-layer FPCB for an electronic device according to a further embodiment of the present invention.
Figure 6:
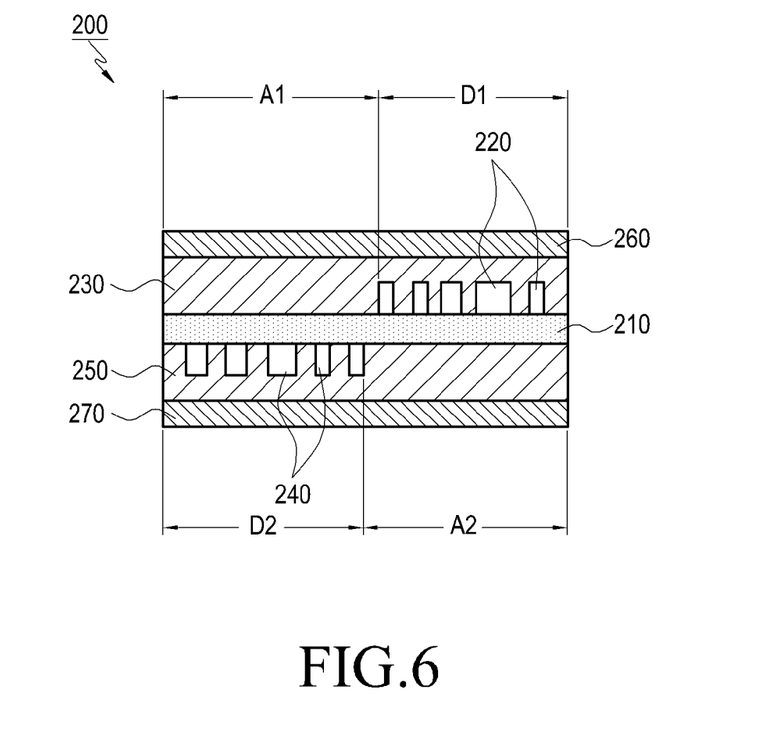
FIG. 6 is a cross-sectional and magnified view of portion VI shown in FIG. 5.

As shown in FIGS. 5 and 6, the multi-layer FPCB 200 for an electronic device according to a further embodiment of the present invention includes a base layer 210, a first circuit pattern 220, a second circuit pattern 240, a first adhesive layer 230, a second adhesive layer 250, a first insulating/protecting layer 260, and a second insulating/protecting layer 270.

The first circuit pattern 220 is provided in the side region D1 on a top surface of the base layer 210 to improve the flexibility of the multi-layer FPCB 200. The first adhesive layer 230 is provided on the top surface of the base layer 210 for adhesion between the first circuit pattern 220 and the first insulating/protecting layer 260. The second circuit pattern 240 is provided on a bottom surface of the base layer 210 and in the other-side region D2 opposite to the side region D1 to improve the flexibility of the multi-layer FPCB 200. The second adhesive layer 250 is provided on the bottom surface of the base layer 210 for adhesion between the second circuit pattern 240 and the second insulating/protecting layer 270. The first insulating/protecting layer 260 is provided on a top surface of the first adhesive layer 230 to insulate/protect the first circuit pattern 220 and the first adhesive layer 230. The second insulating/protecting layer 270 is provided on a bottom surface of the second adhesive layer 250 to insulate/protect the second circuit pattern 240 and the second adhesive layer 250.

As shown in FIG. 6, the first circuit pattern 220 and the second circuit pattern 240 are arranged alternately.

As shown in FIG. 6, the side region A1 differs from the side region D1 on the top surface of the base layer 210, due to the removal of a portion of the first circuit pattern 220. Similarly, the other-side region A2 differs from the other-side region D2 on the bottom surface of the base layer 210, due to the removal of a portion of the second circuit pattern 240.

As shown in FIG. 6, the first adhesive layer 230 and second adhesive layer 250 are provided on the entire regions of the top surface and bottom surface of the base layer 210, respectively.

The base layer 210, and the first insulating/protecting layer 260 and the second insulating/protecting layer 270 are formed of film layers or other layers which provide the same effect as the film layers, such as sheet layers, etc.

In this state, as shown in FIGS. 5 and 6, the multi-layer FPCB 200 includes the base layer 210, the first circuit pattern 220, the second circuit pattern 240, the first adhesive layer 230 and the second adhesive layer 250 which are provided on the top surface and the bottom surface of the base layer 210, and the first insulating/protecting layer 260 and the second insulating/protecting layer 270.

As shown in FIG. 6, the first circuit pattern 220 is provided in the side region D1 on the top surface of the base layer 210. On the entire region of the top surface of the base layer 210 is provided the first adhesive layer 230, on a top surface of which the first insulating/protecting layer 260 is provided.

From the side region A1, as compared to the side region D1 on the top surface of the base layer 210, a portion of the first circuit pattern 220 is removed.

As shown in FIG. 6, the second circuit pattern 240 is provided in the other-side region D2 opposite to the side region D1 on the bottom surface of the base layer 210. On the entire region of the bottom surface of the base layer 210 is provided the second adhesive layer 250, on a bottom surface of which the second insulating/protecting layer 270 is provided.

From the other-side region A2, as compared to the other-side region D2 on the bottom surface of the base layer 210, a portion of the second circuit pattern 240 is removed.

As such, the first and second circuit patterns 220 and 240 are arranged alternately on the top surface and bottom surface of the base layer 210, and are removed from the regions A1 and A2, thereby reducing the thickness of a product to improve the flexibility of the product, improving enforcement strength between a connector (not shown) of a plurality of PCBs (not shown) provided in an electronic device (not shown) and the circuit-side connector 6 of the product. Additionally, the above-described embodiment prevents damage and cracking from being generated in a position adjacent to the circuit-side connector 6 of the product thereby improving the reliability of the product.

Figure 7:
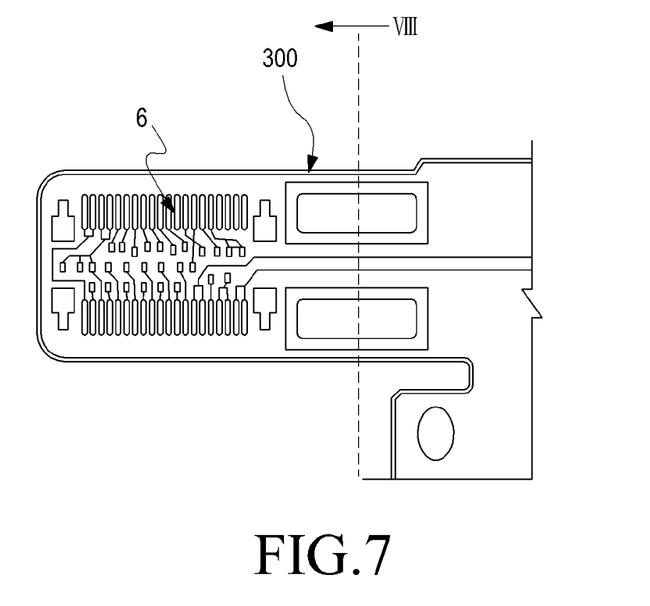
FIG. 7 is a diagram showing a multi-layer FPCB for an electronic device according to a further embodiment of the present invention.
Figure 8:
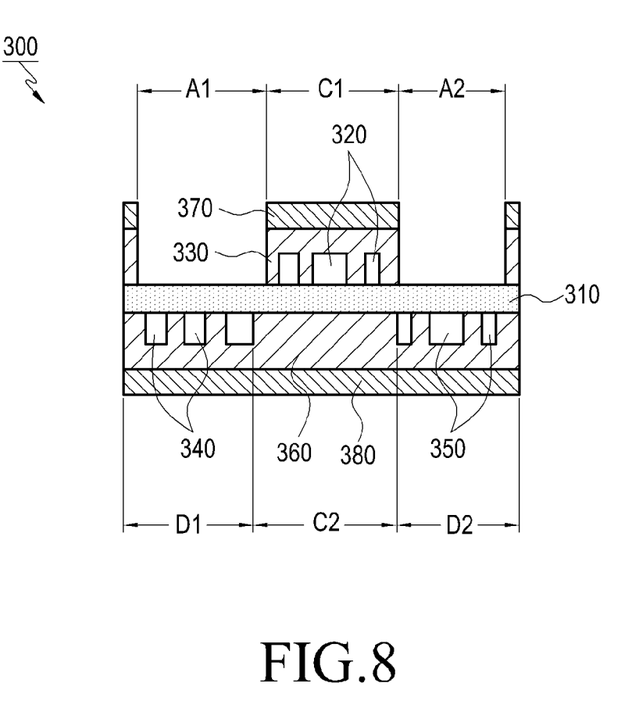
FIG. 8 is a cross-sectional and magnified view of portion VIII shown in FIG. 7.

As shown in FIGS. 7 and 8, the multi-layer FPCB 300 for an electronic device according to a further embodiment of the present invention includes a base layer 310, a first circuit pattern 320, a second circuit pattern 340, a third circuit pattern 350, a first adhesive layer 330, a second adhesive layer 360, a first insulating/protecting layer 370, and a second insulating/protecting layer 380.

The first circuit pattern 320 is provided in a center region C1 on a top surface of the base layer 310 to improve the flexibility of the multi-layer FPCB 300. The first adhesive layer 330 is provided in the first circuit pattern 320 for adhesion between the first circuit pattern 320 and the first insulating/protecting layer 370. The second circuit pattern 340 and the third circuit pattern 350 are provided on a bottom surface of the base layer 310 and in the side region D1 or the other-side region D2 opposite to the center region C1 to improve the flexibility of the multi-layer FPCB 300. The second adhesive layer 360 is provided in the second circuit pattern 340 and the third circuit pattern 350 for adhesion between the second and third circuit patterns 340 and 350 and the second insulating/protecting layer 380. The first insulating/protecting layer 370 is provided on a top surface of the first adhesive layer 330 to insulate/protect the first circuit pattern 320 and the first adhesive layer 330. The second insulating/protecting layer 380 is provided on a bottom surface of the second adhesive layer 360 to insulate/protect the second and third circuit patterns 340 and 350 and the second adhesive layer 360.

As shown in FIG. 8, from the side region A1 and the other-side region A2, which are adjacent to the center region C1 on the top surface of the base layer 310, are removed the first circuit pattern 320, the first adhesive layer 330, and the first insulating/protecting layer 370. Similarly, the second circuit pattern 340 is removed from a center region C2 on the bottom surface of the base layer 310.

The base layer 310 and the first and second insulating/protecting layers 370 and 380 may be formed of film layers or other layers which provide the same effect as the film layers, such as sheet layers, etc.

In this state, as shown in FIGS. 7 and 8, the multi-layer FPCB 300 includes the base layer 310, the first, second, and third circuit patterns 320, 340, and 350, the first and second adhesive layers 330 and 360, and the first and second insulating/protecting layers 370 and 380, respectively.

As shown in FIG. 8, in the center region C1 on the top surface of the base layer 310 is provided the first circuit pattern 320 in which the first adhesive layer 330 is provided. On the top surface of the first adhesive layer 330 is provided the first insulating/protecting layer 370.

In this state, as shown in FIG. 8, in the side region D1 at a side of the center region C2 on the bottom surface of the base layer 310 is provided the second circuit pattern 340, in the other-side region D2 at the other side of the center region C2 is provided the third circuit pattern 350. In the second circuit pattern 340 and the third circuit pattern 350 is provided the second adhesive layer 360, and on the bottom surface of the second adhesive layer 360 is provided the second insulating/protecting layer 380.

As shown in FIG. 8, the second circuit pattern 340 and the third circuit pattern 350 are arranged alternately with the first circuit pattern 320, and the second circuit pattern 340 is removed from the center region C2 on the bottom surface of the base layer 310.

As such, the first circuit pattern 320 and the second and third circuit patterns 340 and 350, respectively, are arranged alternately on the top surface and bottom surface of the base layer 310. The first circuit pattern 320, the first adhesive layer 330, and the first insulating/protecting layer 370 are removed from the regions A1 and A2 on the top surface of the base layer 310, and the second circuit pattern 340 is removed from the center region C2 on the bottom surface of the base layer 310, thereby reducing the thickness of a product to improve the flexibility of the product and improving enforcement strength between a connector (not shown) of a plurality of PCBs (not shown) provided in an electronic device (not shown) and the circuit-side connector 6 of the product.

Figure 9:
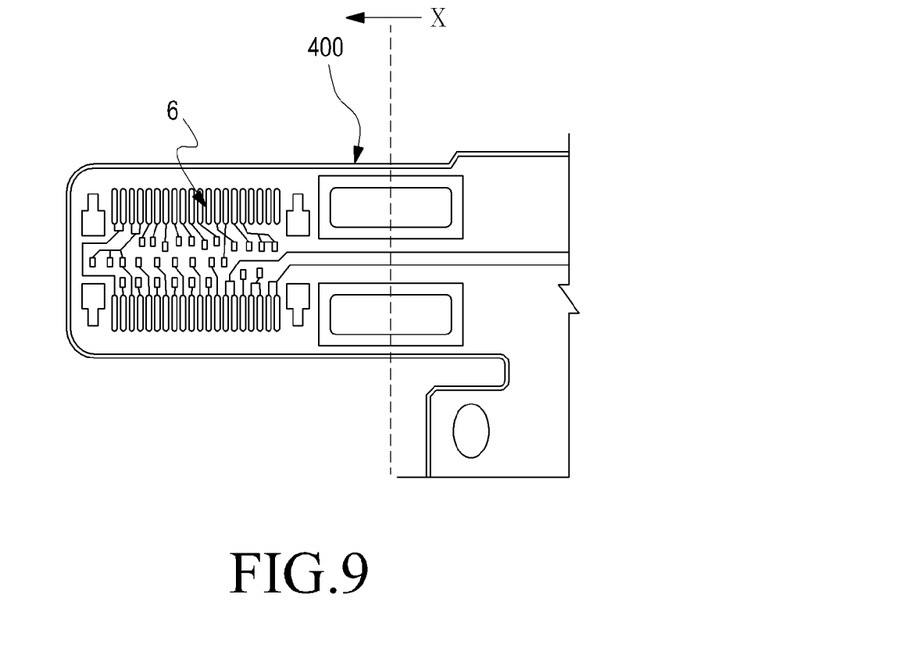
FIG. 9 is a diagram showing a multi-layer FPCB for an electronic device according to a further embodiment of the present invention.
Figure 10:
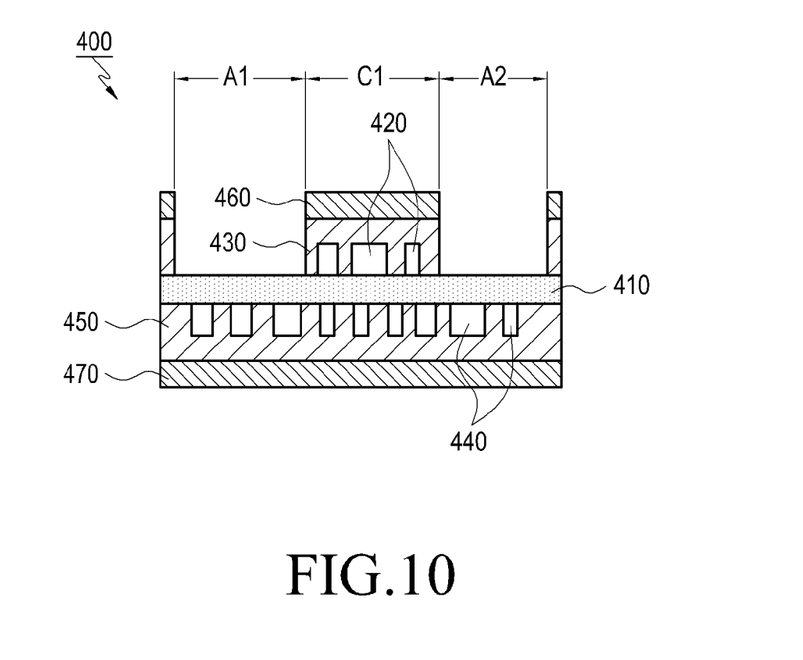
FIG. 10 is a cross-sectional and magnified view of portion X shown in FIG. 9.

As shown in FIGS. 9 and 10, the multi-layer FPCB 400 for an electronic device according to a further embodiment of the present invention includes a base layer 410, a first circuit pattern 420, a second circuit pattern 440, a first adhesive layer 430, a second adhesive layer 450, a first insulating/protecting layer 460, and a second insulating/protecting layer 470.

The first circuit pattern 420 is provided in the center region C1 on a top surface of the base layer 410 to improve the flexibility of the multi-layer FPCB 400. The first adhesive layer 430 is provided in the first circuit pattern 420 for adhesion between the first circuit pattern 420 and the first insulating/protecting layer 460. The second circuit pattern 440 is provided on a bottom surface of the base layer 410 to improve the flexibility of the multi-layer FPCB 400. The second adhesive layer 450 is provided in the second circuit pattern 440 for adhesion between the second circuit pattern 440 and the second insulating/protecting layer 470. The first insulating/protecting layer 460 is provided on a top surface of the first adhesive layer 430 to insulate/protect the first circuit pattern 420 and the first adhesive layer 430. The second insulating/protecting layer 470 is provided on a bottom surface of the second adhesive layer 450 to insulate/protect the second circuit pattern 440 and the second adhesive layer 450.

As shown in FIG. 10, from the side region A1 and the other-side region A2, which are adjacent to center region C1 on the top surface of the base layer 410, are removed the first circuit pattern 420, the first adhesive layer 430, and the first insulating/protecting layer 460.

The base layer 410 and the first and second insulating/protecting layers 460 and 470 are formed of film layers or other layers which provide the same effect as the film layers, such as sheet layers, etc.

In this state, as shown in FIGS. 9 and 10, the multi-layer FPCB 400 includes the base layer 410, the first and second circuit patterns 420 and 440, the first and second adhesive layers 430 and 450, and the first and second insulating/protecting layers 460 and 470, respectively.

As shown in FIG. 10, in the center region C1 on the top surface of the base layer 410 is provided the first circuit pattern 420 in which the first adhesive layer 430 is provided. On the top surface of the first adhesive layer 430 is provided the first insulating/protecting layer 460.

In this state, as shown in FIG. 10, on the bottom surface of the base layer 410 are provided the second circuit pattern 440 and the second adhesive layer 450, and on the bottom surface of the second adhesive layer 450 is provided the second insulating/protecting layer 470.

As such, the first circuit pattern 420 is arranged in the center region C1 on the top surface of the base layer 410 and the first circuit pattern 420, the first adhesive layer 430, and the first insulating/protecting layer 460 are removed from the regions A1 and A2, thereby reducing the thickness of a product to improve the flexibility of the product and improving enforcement strength between a connector (not shown) of a plurality of FPCBs (not shown) provided in an electronic device (not shown) and the circuit-side connector 6 of the product.

The multi-layer FPCBs 100, 200, 300, and 400 according to the embodiments of the present invention may be applied to electronic devices as representative examples. However, the multi-layer FPCBs 100, 200, 300, and 400 may also be applied to various types of electronic devices such as a portable communication device, a radio set, a computer, a camera, a monitor, and so forth.

Examples of the electronic device according to embodiments of the present invention may include not only mobile communication terminals operating according to communication protocols corresponding to various communication systems, but also any information communication apparatuses, electronic apparatuses, and multimedia apparatuses such as Portable Multimedia Players (PMPs), MP3 players, game players, notebooks, advertisement boards, TVs, digital broadcasting players, Personal Digital Assistants (PDAs), and smart phones, and so forth, and their application apparatuses.

While the present invention has been shown and described with reference to certain embodiments thereof, it will be understood by those skilled in the art that various changes in form and details may be made therein without departing from the spirit and scope of the invention. Therefore, the spirit and scope of the present invention must be defined not by the described embodiments thereof but by the appended claims and their equivalents.

What is claimed is:

1. A multi-layer Flexible Printed Circuit Board (FPCB) for an electronic device, the multi-layer FPCB comprising:

a base layer having a top surface and a bottom surface;

a first circuit pattern provided on a first region on the top surface of the base layer;

a first adhesive layer provided over and in the first circuit pattern;

a second circuit pattern provided on a second region on the bottom surface of the base layer;

a second adhesive layer provided over and in the second circuit pattern;

a first insulating/protecting layer provided on a top surface of the first adhesive layer; and a second insulating/protecting layer provided on a bottom surface of the second adhesive layer;

wherein a third region comprises an area on the bottom surface opposite to the first region;

wherein a fourth region comprises an area on the top surface opposite to the second region on the bottom surface; and wherein the third and fourth regions are substantially clear of circuit patterns, adhesive layers, and insulating/protecting layers.

2. The multi-layer FPCB of claim 1, wherein the first and second circuit patterns, the first and second adhesive layers, and the first and second insulating/protective layers are arranged alternately.

3. The multi-layer FPCB of claim 1, wherein the base layer and the first and second insulating/protecting layers are formed of film layers.

4. The multi-layer FPCB of claim 1, wherein at least one of the first adhesive layer and the first insulating/protecting layer slightly overlaps the fourth region.

5. The multi-layer FPCB of claim 1, wherein at least one of the second adhesive layer and the second insulating/protecting layer slightly overlaps the third region.

* * * * *